United States Patent
Leussler et al.

(10) Patent No.: US 11,163,026 B2
(45) Date of Patent: Nov. 2, 2021

(54) MRI SYSTEM WITH OPTIMIZED RF TRANSMIT AND RECEIVE CAPABILITIES

(71) Applicant: KONINKLIJKE PHILIPS N.V., Eindhoven (NL)

(72) Inventors: Christoph Leussler, Hamburg (DE); Oliver Lips, Hamburg (DE); Ingo Schmale, Hamburg (DE)

(73) Assignee: Koninklijke Philips N.V., Einhoven (NL)

( * ) Notice: Subject to any disclaimer, the term of this patent is extended or adjusted under 35 U.S.C. 154(b) by 60 days.

(21) Appl. No.: 16/498,454

(22) PCT Filed: Mar. 26, 2018

(86) PCT No.: PCT/EP2018/057604
§ 371 (c)(1),
(2) Date: Sep. 27, 2019

(87) PCT Pub. No.: WO2018/177988
PCT Pub. Date: Oct. 4, 2018

(65) Prior Publication Data
US 2021/0088607 A1     Mar. 25, 2021

(30) Foreign Application Priority Data
Mar. 30, 2017   (EP) .................................... 17163866

(51) Int. Cl.
*G01R 33/36*     (2006.01)
*G01R 33/34*     (2006.01)
(52) U.S. Cl.
CPC ... *G01R 33/3628* (2013.01); *G01R 33/34076* (2013.01); *G01R 33/3621* (2013.01)

(58) Field of Classification Search
USPC ......................................................... 324/309
See application file for complete search history.

(56) References Cited

U.S. PATENT DOCUMENTS 4,776,341 A * 10/1988 Bachus .................. G01R 33/36
                                                                  324/309
4,825,164 A *  4/1989 Requardt ......... G01R 33/34046
                                                                  324/318

(Continued)

FOREIGN PATENT DOCUMENTS

WO     2004089211 A1    10/2004

OTHER PUBLICATIONS

Highly Efficient Inductively Coupled Double Resonant Surface Coil for Simultaneous 1H/19F PET-MRI, ISMRM 2013, p. 828.
Search Report from PCT/EP2018/057604 dated Jul. 12, 2018.

*Primary Examiner* — Rodney E Fuller

(57) ABSTRACT

A magnetic resonance imaging system (100) comprising a main magnet (104) for generating a main magnetic field within an imaging zone (108); a radio frequency, RF, antenna (114), comprising an RF input terminal (300) and an RF output terminal (302); an RF system for supplying radio-frequency power to the RF input terminal (300) to energize the antenna (114), the antenna (114) being further adapted for picking up magnetic resonance signals (144) from the imaging zone (108); a data acquisition system (126) for receiving the magnetic resonance signals (144) from the RF output terminal (302); wherein the RF input terminal (300) is in galvanic connection to the antenna (114) and the RF output terminal (302) is inductively coupled to the antenna (114).

20 Claims, 4 Drawing Sheets

(56) References Cited

U.S. PATENT DOCUMENTS

| | | | |
|---|---|---|---|
| 5,144,239 A * | 9/1992 | Oppelt | G01R 33/34076 |
| | | | 324/318 |
| 5,384,536 A | 1/1995 | Murakami et al. | |
| 8,324,899 B2 * | 12/2012 | Hoogeveen | G01R 33/3621 |
| | | | 324/318 |
| 2005/0237060 A1 * | 10/2005 | Freytag | G01R 33/34076 |
| | | | 324/318 |
| 2008/0284436 A1 * | 11/2008 | Weizenecker | G01R 33/3415 |
| | | | 324/318 |
| 2009/0160442 A1 | 6/2009 | Mazurwewitz et al. | |
| 2010/0188086 A1 * | 7/2010 | Lazar | G01R 33/3628 |
| | | | 324/318 |
| 2014/0225613 A1 | 8/2014 | Reykowski | |
| 2015/0002156 A1 * | 1/2015 | Leussler | G01R 33/446 |
| | | | 324/322 |
| 2015/0276898 A1 * | 10/2015 | Findeklee | G01R 33/34076 |
| | | | 324/309 |
| 2016/0033591 A1 * | 2/2016 | Leussler | G01R 33/34053 |
| | | | 324/309 |

* cited by examiner

MRI SYSTEM WITH OPTIMIZED RF TRANSMIT AND RECEIVE CAPABILITIES

CROSS REFERENCE TO RELATED APPLICATIONS

This application is a U.S. national phase application of International Application No. PCT/EP2018/057604 filed on Mar. 26, 2018, which claims the benefit of EP Application Ser. No. 17163866.1 filed on Mar. 30, 2017 and is incorporated herein by reference.

FIELD OF THE INVENTION

The invention relates to a magnetic resonance imaging system, a radio-frequency antenna, a method of operating a magnetic resonance imaging system and a computer program product.

BACKGROUND OF THE INVENTION

Magnetic resonance imaging (MRI) is state of the art imaging technology which allows cross-sectional viewing of objects like the human body with unprecedented tissue contrast. MRI is based on the principles of nuclear magnetic resonance, a spectroscopic technique used by scientists to obtain microscopic chemical and physical information about molecules. The basis of both, nuclear magnetic resonance and MRI is the fact, that atomic nuclei with non-zero spin have a magnetic moment. In medical imaging, for example nuclei of hydrogen atoms are studied since they are present in the body in high concentrations like for example water. The nuclear spin of elementary particles can resonate at a resonant frequency, if a strong DC magnetic field is applied. This magnet resonance (MR) frequency is determined by the level of magnetic flux. In the MRI scanner, the magnetic field matches the selected resonance frequency only at a position in space. Only at this position the presence of these particles can be detected. By varying this position, an image can be measured.

The needed strong DC magnetic field (BO field) is typically generated by superconducting magnets. In order to vary this field, such that it matches a given radio-frequency only at one position, a field gradient is generated using gradient coils. A field gradient can vary over time to achieve a scan.

To excite nuclear resonances, the RF coil generates a high frequency magnetic field at the nuclear resonance. The magnetic field must direct in a radial direction with respect to the axis of the MRI scanner. To achieve a radial magnetic field in all directions, a rotating field is used, which points in any radial direction at one point of time during one period. This is achieved using for example a so called 'birdcage' arrangement. Currents in opposing slabs of the birdcage flow in opposite direction and thus generate a radial field. Currents in neighbor leg or rung conductors have a phase shift, such that the field rotates.

The coil is generally a highly resonant antenna, designed for generating the well-defined magnetic field inside the human body. As a side effect, electric fields are causing losses which strongly change the input impedance of the coil. This mainly affects the real part of the impedance, the relative change being linked to the resonance equality factor change, also called the load factor. This is typically in the range of 3-5 for today's birdcage resonators which are the preferred implementation for MRI body coils.

The power fed into the body coil is produced by pulsed amplifiers, which demand a good or at least acceptable power matching at their output. Conventional birdcage resonators are directly fed at the coil ports using matching circuits. At one point 1.5 T in quadrature operation, this is typically realized by using a hybrid coupler to drive two quadrature channels of the coil simultaneously. This coupler is a 4-port, which has the coil feeding ports connected to its outputs, the amplifier at one input and a load, typically 50 ohm, matching the transmission line impedance, connected to the fourth.

At 3T, the two separate individually transmit channels are connected via a transmit-receive box to the RF input ports of the body coil.

U.S. Pat. No. 5,384,536 relates to a nuclear magnetic resonance inspection apparatus comprising an eradiation coil, a detection coil and analogue-to-digital conversion means for sampling a nuclear magnetic resonance signal and converting the sample signal into a digital signal, and transmission means for transmitting wirelessly the digital signal to a signal processor. The international application WO2007/049167 discloses an RF coil with conductor loops on a conformal surface that substantially conforms with the subject to be imaged (for example the shoulder of a patient to be examined) The conductor loops form a resonant structure. This resonant structure is realised by coupling of the conductor loops which may be galvanically or inductively or both.

SUMMARY OF THE INVENTION

Embodiments of the invention provide for a magnetic resonance imaging system comprising a main magnet for generating a main magnetic field within an imaging zone, a radio-frequency, RF, antenna, comprising an RF input terminal and an RF output terminal, an RF system for supplying radio-frequency power to the RF input terminal to energize the antenna, the antenna being further adapted for picking up magnetic resonance signals from the imaging zone, the antenna e.g. comprising a plurality of coil elements; a data acquisition system for receiving the magnetic resonance signals from the RF output terminal; wherein the RF input terminal is in galvanic connection to the antenna and the RF output terminal is inductively coupled to the antenna.

The term 'galvanic connection' refers to an electrical connection in which the current path of the RF input terminal and the antenna are coupled via a common impedance, such that the respective currents flowing in the antenna and the RF input terminal are flowing over the common impedance. The common impedance may be realized by means of a direct conduction path, i.e. a hardwire electrical connector. However, the impedance may also be realized by means of a coupling of the antenna and the RF input terminal via a capacitance.

In contrast thereto, the term 'inductive coupling' refers to an electrical isolation between the RF output terminal and the antenna such that no direct conduction path is permitted. Currents in the antenna are only inductively generating respective currents in the RF output terminal through electromagnetic induction.

Further, the term 'terminal' relates to an electrical connection point to which electrical energy can be supplied or from which electrical energy can be derived by a direct electrical connection using for example a hardwired electrical connection from e.g. an RF amplifier in case of the RF input terminal and e.g. an RF receiver in case of the RF output terminal.

Embodiments may have the advantage that due to the inductive feeding only for the receive path and galvanic feeding for the transmit path, a separate send-receive box is eliminated which typically has to be able to operate the coil in a respective manner during the transmit phase and the receive phase: it is the goal on one hand to ensure to direct a high powered transmit signal from the RF amplifier to the antenna, while also allowing a low loss connection between the antenna and the RF receiver. The conventional transmit-receive box, also called T/R switch, causes a signal path to be created between the RF amplifier and the antenna whenever a system is in transmit mode, wherein during a receive mode, the T/R switch generates a signal path between the antenna and the RF receiver, for example via a pre-amplifier.

In contrast thereto, by using the inductive feeding only for the receive path and galvanic feeding for the transmit path, the T/R switch (or send-receive box) is eliminated and the overall image quality may be improved. Since the RF output terminal is only inductively coupled to the coil, noise contributions from cable currents and ground loops are omitted, since the transmit path is separate and galvanically coupled to the coil structure such that any B1 excitation is not disturbed. In addition, Tx and Rx paths can be optimized in this way more independently since they do not have to share a common cable anymore (e.g. if the cable length is applied to optimize the matching).

In accordance with an embodiment of the invention, the magnetic resonance imaging system further comprises a pre-amplifier, wherein the inductive coupling of the RF output terminal is comprising an inductive coupling of the pre-amplifier to the antenna and the galvanic connection of the pre-amplifier in the output terminal. This may have the advantage that the RF signal acquired by the antenna can be picked up and amplified by the pre-amplifier at an extremely short distance from the coil since there is no need for respecting any cable length between the antenna and the pre-amplifier that would need to satisfy a certain impedance matching due to a common transmission and receive path shared between a transmit-receive box and the antenna. Further, since the pre-amplifier is inductively coupled to the antenna, the pre-amplifier is not connected to the antenna via ground such that the formation of sheath waves in coaxial cables between the antenna and the RF pre-amplifier are avoided. This may further increase the signal-to-noise ratio at which the pre-amplifier can provide the RF signals to the output terminal.

In accordance with an embodiment of the invention, the RF input terminal and/or the RF output terminal are each comprising an independently adjustable impedance matching circuit for matching the impedance of the respective terminal to a desired impedance. For example the impedance matching circuit of the RF input terminal is providing a matching impedance to the radio-frequency power supplied from the RF system to the RF input terminal and a permanent high impedance to the current of the magnetic resonance signals picked up by the antenna. Typically, the matching impedance will be 50 Ohm such that RF power supplied from the RF system to the RF input terminal can be fed to the RF antenna with minimal losses. Any magnetic resonance signals picked up as RF signals by the antenna are blocked from being transmitted towards the RF system due to the high impedance. In contrast thereto, the RF output terminal is matched regarding its impedance to the electrical circuits directly electrically coupled to the RF output terminal and used for transmitting the pre-amplified RF signals (MR signals) to the respective receiving unit. These circuits may include A/D converters and for example an optical or wireless transmitter to optically or wirelessly (using RF transmission) transmit the acquired MR signals to the receiver.

In accordance with an embodiment of the invention, the system further comprises an analogue-to-digital, AD, converter, the analogue port of the AD converter being coupled with the output terminal.

In accordance with an embodiment the invention, the system further comprises a switch for selectively performing the coupling and a decoupling of the antenna with the RF output terminal. In the above example of a pre-amplifier, the switch is selectively performing the coupling and decoupling of the pre-amplifier with the antenna. This may have the advantage that during RF transmission, which is typically performed at rather high power, the RF output terminal or in the above example the pre-amplifier, can be blanked such that an overloading of the pre-amplifier or even the RF receiver behind the RF output terminal is avoided. Thus, this may serve as a protection of electrical components.

In accordance with an embodiment of the invention, the RF antenna comprises a plurality of coil elements, a plurality of the RF input terminals and the RF output terminals, wherein each one of the RF input terminals is galvanically coupled to at least one of the coil elements and each one of the RF output terminals is inductively coupled to at least one of the coil elements. By for example means of an optional selector, a specific one of the RF output terminals can be selected for providing the magnetic resonance signals from said selected RF output terminal to the data acquisition system or receiver. Even though it was mentioned above that the goal is to achieve a radio magnetic field in all directions using a rotating field, in reality the currents in the slabs of the birdcage are not everywhere the same in the birdcage. The currents strongly depend on the load of the coil, for example the patient that is currently imaged using the coil. By means of the selector it is possible to select the one or multiple ones of the RF output terminals that provide the magnetic resonance signals at highest quality.

For example, the system comprises a memory for storing machine-executable instructions and a processor for controlling the magnetic resonance imaging system, wherein execution of the machine-executable instructions causes the processor to control the system to determine which specific one of the RF output terminals provides the magnetic resonance signals with at least a predefined signal-to-noise ratio and to control the selector to select the determined RF output terminal(s).

All this can be performed completely independent of the transmit path since the transmit path is decoupled and independent from the receive path. Especially there are not multiple individual transmit-receive boxes necessary for performing the selection such that the total costs for implementing such a selector for an antenna with multiple coil elements is minimized.

In accordance with an embodiment of the invention, the coil elements of the RF antenna have a birdcage or TEM configuration or a combination of both.

For example, the galvanic connection and/or inductive coupling is across two of the coil elements. Said two coil elements may be coupled to each other via a capacitance.

In accordance with an embodiment of the invention, execution of the machine-executable instructions further causes the processor to control the magnetic resonance imaging system to acquire imaging magnetic resonance data using imaging pulse sequence commands, wherein the imaging pulse sequence commands are configured to control the magnetic resonance imaging system to acquire the imaging magnetic resonance signals according to a magnetic resonance imaging protocol; and reconstruct the magnetic resonance image using the imaging magnetic resonance data. The imaging magnetic resonance signals are received from the RF output terminal.

The term 'imaging protocol' may include any one of: one or more imaging scans, one or more pre-scans, loading of scan protocols, performing a predetermined processing of the received MRI signals and storing the processed MRI signals. The imaging scan protocol may also comprise instructions regarding the reconstruction of the MR image data acquired using the imaging.

The term 'imaging scan' includes both scans including only a single 2D image frame acquisition pass as well as 3D scanning techniques wherein each individual scan is performed as a time series of individual acquisition passes which are equal in terms of parameters and contrast. The term 'scan' may refer to a data acquisition sequence including applying a static magnetic field, a gradient magnetic field, transmitting an RF pulse, receiving an MRI signal, storing the received MRI signal.

In another aspect, the invention relates to an RF antenna for use in a magnetic resonance imaging system, the antenna e.g. comprising a plurality of coil elements, an RF input terminal and an RF output terminal, the RF input terminal being in galvanic connection to the antenna and adapted for receiving an RF input signal to energize the antenna; the RF output terminal being inductively coupled to the antenna and adapted for providing a magnetic resonance signal picked up by the antenna.

In another aspect the invention relates to a method of operating a magnetic resonance imaging system, the system comprising a main magnet for generating a main magnetic field within an imaging zone, an RF antenna comprising an RF input terminal and an RF output terminal, the method comprising supplying by an RF system radio-frequency power to the RF input terminal to energize the antenna; picking up by the antenna magnetic resonance signals from the imaging zone; receiving by a data acquisition system the MR signals from the RF output terminal; wherein the RF input terminal is in galvanic connection to the antenna and the RF output terminal is inductively coupled to the antenna.

In another aspect, the invention relates to a computer program product comprising machine-executable instructions to perform the method as described above. It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image is defined herein as being the reconstructed two or three dimensional visualization of anatomic data contained within the magnetic resonance imaging data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

In the following, like numbered elements in the figures are either similar elements or perform an equivalent function. Elements which have been discussed previously will not necessarily be discussed in later figures if the function is equivalent.

Figure 1:
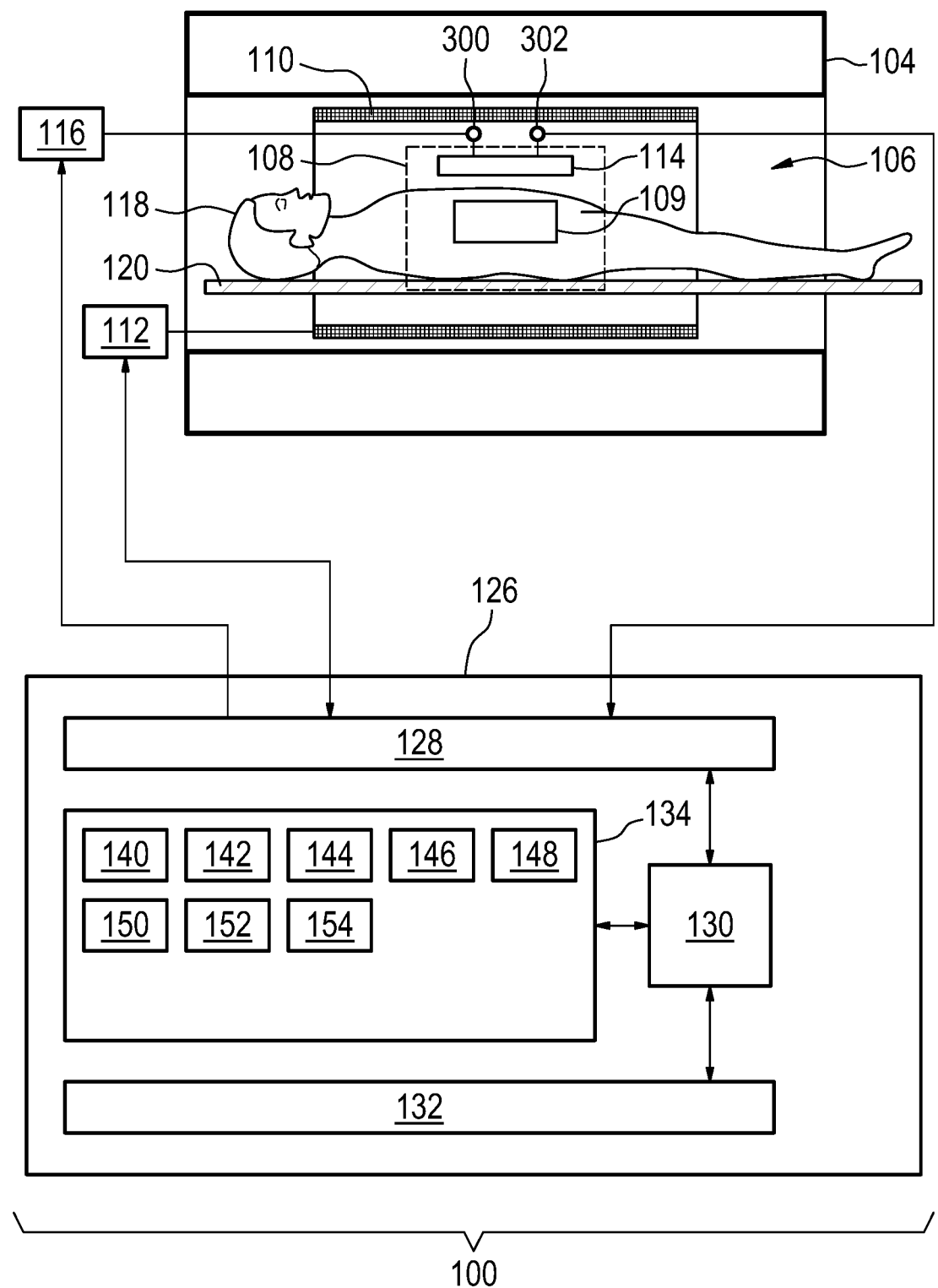
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging. A region of interest 109 is shown within the imaging zone 108. A subject 118, for example a patient, is shown as being supported by a subject support 120, for example a moveable table, such that at least a portion of the subject 118 is within the imaging zone 108 and the region of interest 109.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 "RF antenna" for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to an RF amplifier 116. The radio frequency amplifier 116 is providing RF power to the RF coil 114 for manipulating the orientations of magnetic spins within the imaging zone 108. Further shown in FIG. 1 is an input terminal 300 of the RF coil 114, the input terminal 300 being galvanically coupled to the RF amplifier 116. An RF output terminal 302 of the RF coil 114 is inductively coupled to a receiver of the MR system 100.

The amplifier 116, the gradient controller 112 and the RF output terminal 302 are shown as being connected to a hardware interface 128 of a computer system 126. Thus, the computer system 126 serves also as receiver for receiving and processing the MR signals acquired using the coil 114.

The computer system further comprises a processor 130 that is in communication with the hardware system 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 130 may be considered to be a non-transitory computer-readable medium.

The computer memory 134 is shown as containing machine-executable instructions 140. The machine-executable instructions contain commands or instructions which enable the processor 130 to control the operation and function of the magnetic resonance imaging system 100. The computer memory 134 is shown as further containing imaging scan protocols 142. Each imaging scan protocol may comprise pulse sequence commands for one or multiple pulse sequences which are either instructions or data which may be converted into instructions which enable the processor 130 to control the magnetic resonance imaging system 100 to acquire magnetic resonance data. The pulse sequence commands may therefore be part of an imaging scan protocol. The magnetic resonance data may for instance be used to cause the magnetic resonance imaging system to perform multiple pulse repetitions which cause magnetic resonance signals 144 to be acquired.

Magnetic resonance signals 144 are shown as being stored in the computer memory 134. The magnetic resonance signals 144 for a particular pulse repetition may be collated into the magnetic resonance data 146. The magnetic resonance data 146 may be used to generate a series of images 148. The imaging scan protocols may further comprise instructions 150 regarding the reconstruction of the image data 146 acquired using the imaging.

For example, the antenna 114 has multiple coil elements in a birdcage configuration. Further, multiple ones of the output terminals 302 are provided which are inductively coupled to respective ones of the coil elements. Similarly, multiple ones of the RF input terminals 300 and optionally respective RF amplifiers 116 may be provided. Each one of the RF input terminals 300 may be galvanically coupled to at least one of the coil elements. A selector not shown in FIG. 1 may be controlled using instructions 152 to select specific ones of the RF input terminals and the RF output terminals to provide the RF power to the antenna and to receive the magnetic resonance signals from the antenna, respectively.

Further, instructions 154 may be provided which enable to blank the RF output terminal 302 during the excitation of the nuclear spins using high-power RF pulses by the RF amplifier 116.

Figure 2:
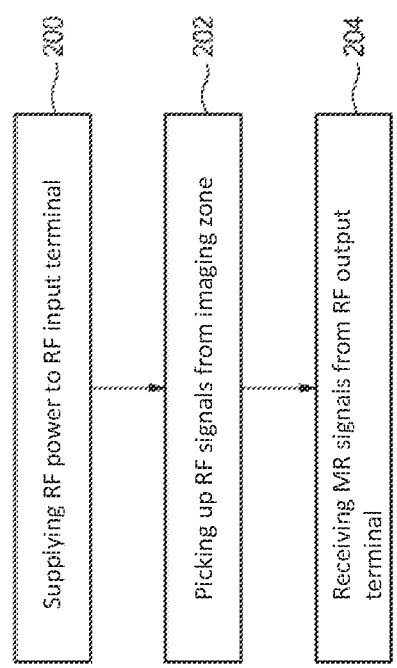
FIG. 2 is a flowchart of a method for performing a magnetic resonance imaging scan.

FIG. 2 is a flowchart of operating a magnetic resonance imaging, wherein the method starts with block 200 and the supplying of an RF pulse to the RF input terminal 300 in order to energize the antenna 114. In block 202, by the antenna 114 magnetic resonance signals are picked up from the imaging zone 108. In block 204 the computer system 126 acting here as the data acquisition system is receiving the RF signals picked up by the antenna from the RF output terminal 302.

Figure 3:
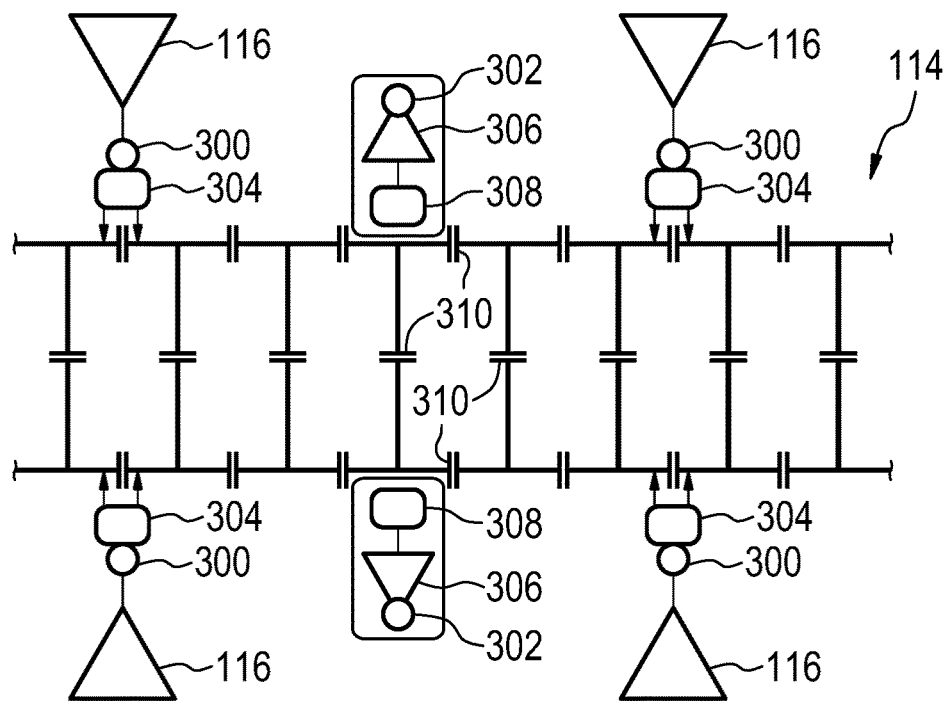
FIG. 3 is a circuit diagram of a birdcage resonator.

FIG. 3 illustrates a circuit diagram of a birdcage resonator 114. Typically a birdcage coil consists of two circular conductive loops referred to as end rings connected by a number of conductive straight elements called rungs. In FIG. 3, the end rings are constituted by the horizontal conductor lines, whereas the rungs are constituted by the vertical conductor lines. Several capacitors 310 are arranged between the individual conducting elements based on the frequency characteristics of the coil 114 desired. In total, the antenna 114 therefore consists of multiple coil elements that can be used for exciting nuclear spins by supplying RF pulses to the coil elements and to receive magnetic resonance signals also using the individual coil elements.

In the configuration depicted in FIG. 3, four RF input terminals 300 and two RF output terminals 302 are shown. The RF input terminals are electrically connecting respective RF amplifiers 116 to a respective match and detune circuit 304, wherein each match and detune circuit 304 is galvanically coupled to two coil elements. In more detail, each match and detune circuit 304 is coupled to two conductive elements of each ring, wherein these two conductive elements are coupled to each other via a respective capacitor 310. Thus, a coil element can be understood as a single electrical conductor slab of the coil or an arrangement of electrical conductors slabs and optional capacitors that form a coil as part of the antenna.

In contrast thereto, each RF output terminal 302 is galvanically coupled to a pre-amplifier 306, whereas the pre-amplifier 306 is inductively coupled to one of the electrical conductors of the ring via a respective inductive coupler 308. In the simplest case, the inductive coupler 308 may be a conductive loop placed in close vicinity to the respective conductor of the ring of the antenna 114.

Not shown in FIG. 3 is an active or passive detuning circuit that may be placed between the inductive coupler 308 and the pre-amplifier 306 and that may be used to actively or passively blank the pre-amplifier 306 and therefore the output terminal 302 during providing the RF power by the amplifier 116 to the RF input terminal 300. Further not shown in FIG. 3 is an analogue-to-digital converter which may be placed in between the pre-amplifier 306 and the output terminal 302 and which serves to digitize the pre-amplified MR signal.

As can be seen from FIG. 3, the coil elements to which the RF input terminal is galvanically connected and the coil elements to which the RF output terminals is inductively coupled are different from each other. However, it will be understood by a skilled person that the coil elements may be identical since in reality the birdcage coil 114 has sufficient space to accommodate for the same coil element both, the galvanic connection to the RF input terminal and the inductive coupling to the RF output terminal.

Since the RF input terminal 300 is hardwired to the antenna 114 via the match and detune circuit 304, the signal-to-noise ratio for coupling an MR excitation signal into the antenna can be easily optimized in such a manner that the impedance looking into the antenna 114 is matched or made equal to the transmission line impedance that connects the input terminal 300 to the RF amplifier 116. The match and detune circuit 304 is further adapted in such a manner that a high impedance is provided for currents induced in the antenna 114 due to excited nuclear resonances. This even holds true in case the load impedance seen by the antenna 114 is varying due to the mass and composition of the material being located within the coil 114, i.e. the imaging zone. The impedance adjustment to the RF coil can be easily managed since only the RF input terminal 300 has to be considered here.

Due to the inductive coupling of the RF output terminal 302 to the antenna 114 (or more specifically to the coil elements of the antenna 114) no separate send-receive switch (hybrid box) unit is required which connects both, the RF amplifier and an RF receiver through a common match and detune circuit to the antenna 114. Since the RF input terminal 300 and the RF output terminal 302 are 'isolated' from each other, RF system losses due to cables and connectors are reduced and the signal-to-noise ratio of the MR signals picked up by the antenna, transmitted via the inductive loop 308 to a pre-amplifier 306 and provided for example converted from the analogue to the digital domain to the output terminal 302 is optimized.

Figure 4:
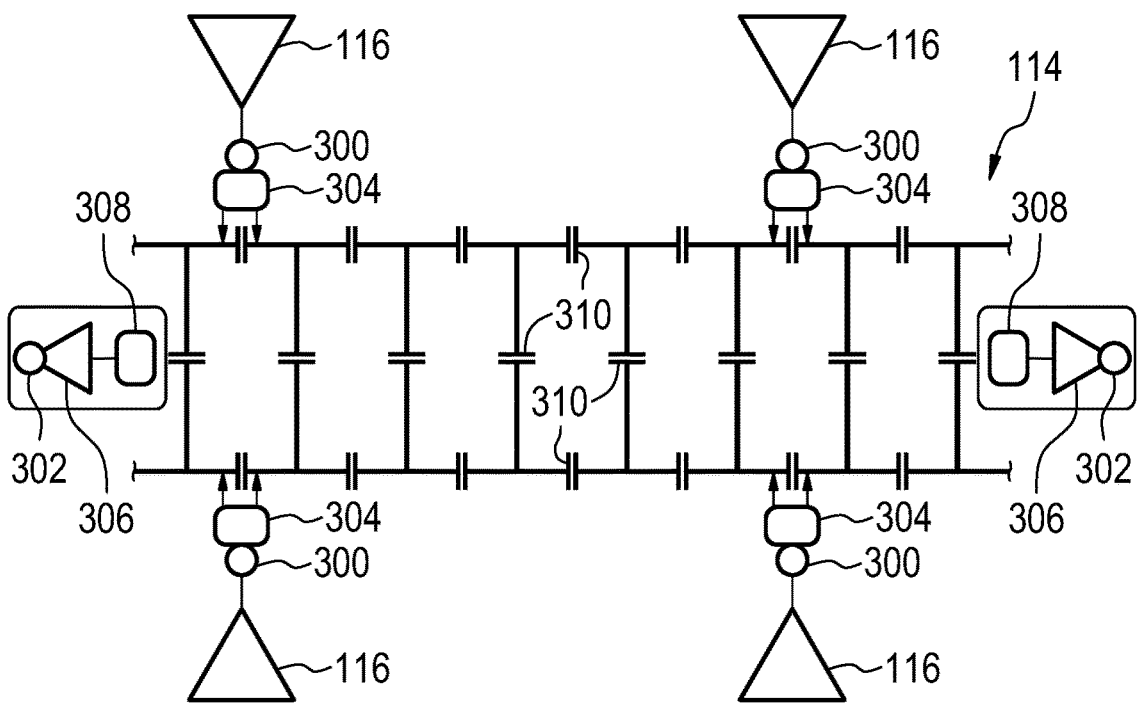
FIG. 4 is a circuit diagram of a birdcage resonator.

FIG. 4 depicts a further circuit diagram of an antenna 114 of a birdcage resonator. The general configuration regarding the arrangement of the rings and rungs, as well as the RF input terminals 300 is identical to the birdcage resonator that was discussed above with respect to FIG. 3. The difference between FIGS. 3 and 4 is that the RF output terminal 302 is coupled in FIG. 3 to a rung. More specifically, the induction loop 308 is inductively coupled simultaneously to two conductive elements of a rung, the two conductive elements being coupled to each other via a capacitor 310. Thus, FIG. 4 depicts an example of a separate rung and ring feeding for the transmit and receive chain. This can also be inverted, thus receive in ring and transmit in rung.

The idea of having the RF input terminal in galvanic connection to the antenna and the RF output terminal in inductive coupling to the antenna can be used in a specific manner for performing an efficient load-dependent matching of antennas of any kind. However, preferred applications are for example an improved matching of large MRI transmit coils since these coils show a high load variation regarding the impedances.

Figure 5:
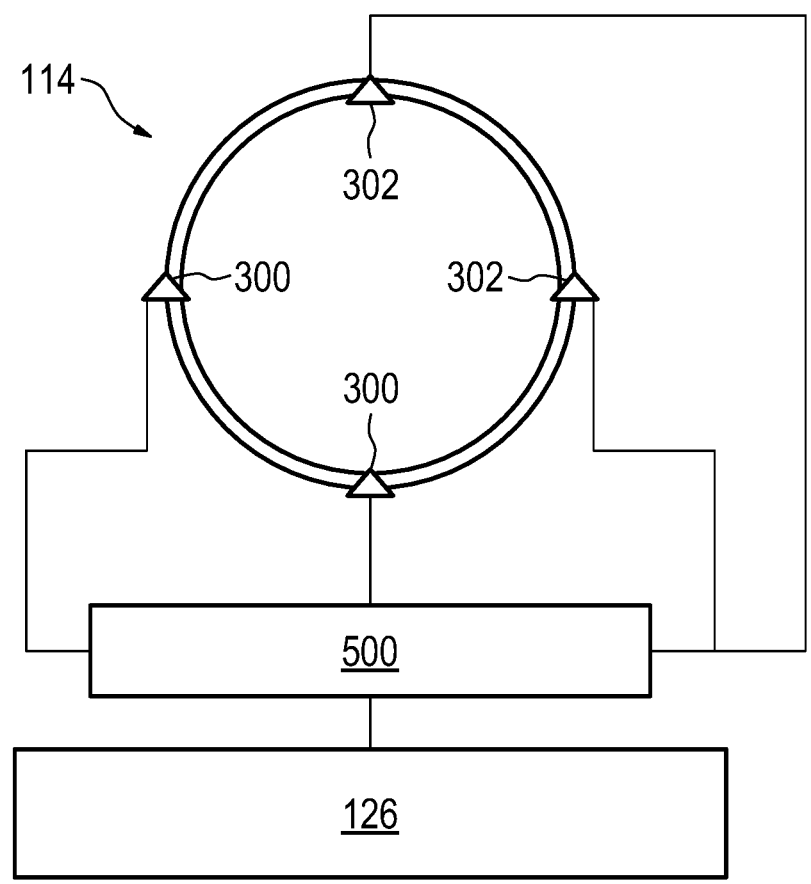
FIG. 5 is a block diagram of a circuit resonator which RF output terminals are electrically connected to a selector.

FIG. 5 shows a block diagram of an MR coil, for example one of the antennas 114 previously discussed with respect to FIGS. 3 and 4. Schematically shown are the input terminals 300 and the output terminals 302. Again, the input terminals 300 are connected galvanically for example via a respective match and detune circuit to the hardwire slabs of which the antenna is made up, whereas the RF output terminals are only inductively coupled to the antenna 114, i.e. the hardwires of the antenna 114.

Besides the computer system 126 which was discussed in FIG. 1 above, additionally a selector 500 is shown. The selector 500 is controlled by the computer system 126 and permits to selectively perform the feeding of RF power to one or more specific ones of the RF input terminals 300 and to selectively receive MR signals from one or more specific ones of the RF output terminals 302. E.g., the selector 500 as controlled by the computer system 126 specifically selects the RF output terminals 302 and the RF input terminals 300 such that the signal-to-noise ratio of the acquired MR signals is maximized.

In one example, the load of the subject to be imaged in the imaging zone is considered and by means of an electromagnetic simulation the RF input terminals 300 are selected which permit for a most efficient coupling of RF excitation signals into the antenna 114. While this configuration is maintained, the selector 500 under control of computer system 126 is used to acquire MR signals from either individual ones of the RF output terminals 302 or from a variety of different combinations of RF output terminals 302. Such acquired MR signals are then evaluated regarding their signal-to-noise ratio. Based on this evaluation, the RF output terminals 302 yielding the highest signal-to-noise ratio of the acquired MR signals are selected for performing the subsequent imaging scan according to the desired imaging protocol.

In conclusion, while the pre-amplifiers are inductively coupled to the antenna thus omitting noise contributions from cable currents and ground loops, the transmit path is separate and galvanically coupled to the electrical coil structure such that the B1 excitation is not disturbed. Preferably, digitization of the acquired MR signals is performed directly at the coil just behind the pre-amplifier, such that the SNR losses of any remote S/R switch (send-receive switch) is negligible. Separate local electronic switching additionally provides protection of the pre-amplifier and RF isolation of the Tx chain during reception. The switching for selectively performing a coupling and decoupling of the antenna with the RF output terminal or more specifically the RF antenna and a pre-amplifier can be realized in a conventional manner, for example by active or passive elements. An active element may be a switch that upon external control signals disconnects the pre-amplifier from the inductive loop, whereas a passive switch may be realized for example using crossed diodes.

LIST OF REFERENCE NUMERALS 100 magnetic resonance imaging system
104 magnet
106 bore of magnet
108 imaging zone
109 region of interest
110 magnetic field gradient coils
112 magnetic field gradient coil power supply
114 radio-frequency coil
116 transceiver
118 subject
120 subject support
126 computer system
128 hardware interface
130 processor
132 user interface
134 computer memory
140 machine-executable instructions
142 pulse sequence commands
144 magnetic resonance signals
146 magnetic resonance data
148 intermediate images
150 image reconstruction instructions
152 selector control instructions
154 blank control instructions
200 supplying RF power to the RF input terminal
202 picking up RF signals from the imaging zone
204 receiving the MR signals from the RF output terminal
300 RF input terminal
302 RF output terminal
304 match and detune circuit
306 pre-amplifier
308 inductive loop
310 capacitor
500 selector

The invention claimed is:

1. A magnetic resonance imaging system comprising:
a main magnet configured to generate a main magnetic field within an imaging zone,
a radio frequency (RF) antenna comprising an RF input terminal and an RF output terminal,
an RF system configured to supply RF power to the RF input terminal to energize the antenna, the RF antenna being further configured to pick up magnetic resonance signals from the imaging zone,
a data acquisition system configured to receive the magnetic resonance signals from the RF output terminal,
wherein the RF input terminal is in galvanic connection to the antenna and the RF output terminal has an inductive coupling with the antenna.

2. The magnetic resonance imaging system of claim 1, further comprising a pre-amplifier, wherein the inductive coupling of the RF output terminal includes an inductive coupling of the pre-amplifier to the antenna and a galvanic connection of the pre-amplifier and the output terminal.

3. The magnetic resonance imaging system of claim 1, wherein the RF input terminal and/or the RF output terminal each further comprising an independently adjustable impedance matching circuit for matching the impedance of the respective terminal to a desired impedance.

4. The magnetic resonance imaging system of claim 3, wherein the impedance matching circuit of the RF input terminal is configured to provide a matching impedance to the RF power supplied from the RF system to the RF input terminal and a permanent high impedance to the currents of the magnetic resonance signals picked up by the antenna.

5. The magnetic resonance imaging system of claim 1, further comprising an analogue to digital (AD) converter, the analogue port of the AD converter being coupled with the output terminal.

6. The magnetic resonance imaging system of claim 1, further comprising a switch configured to selectively perform the coupling and a decoupling of the antenna with the RF output.

7. The magnetic resonance imaging system of claim 1, wherein the antenna comprising a plurality of coil elements, wherein the RF antenna comprises a plurality of the RF input terminals and the RF output terminals, wherein each one of the RF input terminals is galvanically coupled to at least one of the coil elements and each one of the RF output terminals is inductively coupled to at least one of the coil elements.

8. The magnetic resonance imaging system of claim 7, further comprising a selector configured to select one of the RF output terminals for providing the magnetic resonance signals from said selected RF output terminal to the data acquisition system.

9. The magnetic resonance imaging system of claim 8, further comprising a memory configured to store machine executable instructions, and a processor configured to control the magnetic resonance imaging system, wherein execution of the machine executable instructions causes the processor to control the system to
determine which one of the RF output terminals provides the magnetic resonance signals with at least a predefined signal to noise ratio,
control the selector to select the determined RF output terminal.

10. The magnetic resonance imaging system of claim 7, wherein the coil elements of the RF antenna include a birdcage or TEM configuration.

11. The magnetic resonance imaging system of claim 10, wherein at least one of the galvanic connection and the inductive coupling is across two of the coil elements.

12. The magnetic resonance imaging system of claim 1, further comprising a memory configured to store machine executable instructions, and a processor configured to control the magnetic resonance imaging system, wherein execution of the machine executable instructions further causes the processor to:
control the magnetic resonance imaging system to acquire imaging magnetic resonance data using imaging pulse sequence commands, wherein the imaging pulse sequence commands are configured to control the magnetic resonance imaging system to acquire the imaging magnetic resonance signals according to a magnetic resonance imaging protocol; and
reconstruct a magnetic resonance image using the imaging magnetic resonance data.

13. A radio frequency (RF) antenna for use in a magnetic resonance imaging system, the RF antenna comprising:
an RF input terminal and an RF output terminal,
the RF input terminal being in galvanic connection to the antenna and configured to receive an RF input signal to energize the antenna,
the RF output terminal being inductively coupled to the antenna and configured to provide a magnetic resonance signal picked-up by the RF antenna.

14. The RF antenna of claim 13, wherein the RF input terminal and/or the RF output terminal each further comprise an independently adjustable impedance matching circuit for matching the impedance of the respective terminal to a desired impedance.

15. The RF antenna of claim 14, wherein the impedance matching circuit of the RE input terminal is configured to provide a matching impedance to the RF power supplied from the RF system to the RF input terminal and a permanent high impedance to the currents of the magnetic resonance signals picked up by the antenna.

16. The RF antenna of claim 13, further comprising a plurality of coil elements, wherein the RF antenna comprises a plurality of the RF input terminals and the RF output terminals, wherein each one of the RF input terminals is galvanically coupled to at least one of the coil elements and each one of the RF output terminals is inductively coupled to at least one of the coil elements.

17. The RE antenna of claim 16, wherein the coil elements comprise a birdcage or TEM configuration.

18. The RF antenna of claim 17, wherein at least one of the galvanic connection and the inductive coupling is across two of the coil elements.

19. A method of operating a magnetic resonance imaging (MRI) system, the MRI system comprising: a main magnet for generating a main magnetic field within an imaging zone; and a radio frequency (RF) antenna comprising an RF input terminal and an RF output terminal, the method comprising:
    supplying, with an RF system, RF power to the RF input terminal to energize the antenna,
    picking up, with the antenna, magnetic resonance signals from the imaging zone,
    receiving, with a data acquisition system, the magnetic resonance signals from the RF output terminal,
    wherein the RF input terminal is in galvanic connection to the antenna and the RF output terminal is inductively coupled to the antenna.

20. A non-transitory computer readable medium storing instructions stored on a non-transitory computer readable medium of a magnetic resonance imaging (MRI) system executable by a processor to control the MRI system to perform the method of claim 19.

* * * * *